US008729529B2

(12) United States Patent  (10) Patent No.: US 8,729,529 B2
Chaji et al.  (45) Date of Patent: May 20, 2014

(54) THIN FILM TRANSISTOR INCLUDING A NANOCONDUCTOR LAYER

(75) Inventors: Gholamreza Chaji, Waterloo (CA); Maryam Moradi, Melrose, IL (US)

(73) Assignee: Ignis Innovation Inc., Waterloo, Ontario (CA)

( * ) Notice: Subject to any disclaimer, the term of this patent is extended or adjusted under 35 U.S.C. 154(b) by 0 days.

(21) Appl. No.: 13/563,930

(22) Filed: Aug. 1, 2012

(65) Prior Publication Data

US 2013/0032784 A1    Feb. 7, 2013

Related U.S. Application Data

(60) Provisional application No. 61/514,887, filed on Aug. 3, 2011.

(51) Int. Cl.
  *H01L 29/786*  (2006.01)
  *H01L 21/336*  (2006.01)
(52) U.S. Cl.
  USPC  257/27; 438/158; 257/E29.299; 257/E21.414
(58) Field of Classification Search
  USPC .............. 257/27, E29.299, E21.414; 438/158
  See application file for complete search history.

(56) References Cited

U.S. PATENT DOCUMENTS

| | | | | |
|---|---|---|---|---|
| 6,891,227 | B2 * | 5/2005 | Appenzeller et al. | 257/346 |
| 7,064,372 | B2 * | 6/2006 | Duan et al. | 257/296 |
| 2006/0240605 | A1 | 10/2006 | Moon et al. | |
| 2009/0152553 | A1 | 6/2009 | Yoon et al. | |
| 2009/0283753 | A1 | 11/2009 | Jiang et al. | |

FOREIGN PATENT DOCUMENTS

| | | |
|---|---|---|
| EP | 2 161 756 | 3/2010 |
| KR | 2009/0106057 | 10/2009 |

OTHER PUBLICATIONS

Ahnood et al.: "Effect of threshold voltage instability on field effect mobility in thin film transistors deduced from constant current measurements"; dated Aug. 2009.
Alexander et al.: "Pixel circuits and drive schemes for glass and elastic AMOLED displays"; dated Jul. 2005 (9 pages).
Alexander et al.: "Unique Electrical Measurement Technology for Compensation, Inspection, and Process Diagnostics of AMOLED HDTV"; dated May 2010 (4 pages).
Arokia Nathan et al., "Amorphous Silicon Thin Film Transistor Circuit Integration for Organic LED Displays on Glass and Plastic", IEEE Journal of Solid-State Circuits, vol. 39, No. 9, Sep. 2004, pp. 1477-1486.

(Continued)

*Primary Examiner* — Matthew W Such
*Assistant Examiner* — Monica D Harrison
(74) *Attorney, Agent, or Firm* — Nixon Peabody LLP

(57) ABSTRACT

A thin film transistor having a channel region including a nanoconductor layer. The nanoconductor layer can be a dispersed monolayer of nanotubes or nanowires formed of carbon. The thin film transistor generally includes a gate terminal insulated by a dielectric layer. The nanoconductor layer is placed on the dielectric layer and a layer of semiconductor material is developed over the nanoconductor layer to form the channel region of the thin film transistor. A drain terminal and a source terminal are then formed on the semiconductor layer. At low field effect levels, the operation of the thin film transistor is dominated by the semiconductor layer, which provides good leakage current performance. At high field effect levels, the charge transfer characteristics of the channel region are enhanced by the nanoconductor layer such that the effective mobility of the thin film transistor is enhanced.

14 Claims, 4 Drawing Sheets

(56) References Cited

OTHER PUBLICATIONS

Ashtiani et al.: "AMOLED Pixel Circuit With Electronic Compensation of Luminance Degradation"; dated Mar. 2007 (4 pages).
Chaji et al.: "A Current-Mode Comparator for Digital Calibration of Amorphous Silicon Amoled Displays"; dated Jul. 2008 (5 pages).
Chaji et al.: "A fast settling current driver based on the CCII for AMOLED displays"; dated Dec. 2009 (6 pages).
Chaji et al.: "A Low-Cost Stable Amorphous Silicon Amoled Display with Full V~T- and V~O~L~E~D Shift Compensation"; dated May 2007 (4 pages).
Chaji et al.: "A low-power driving scheme for a-Si:H active-matrix organic light-emitting diode displays"; dated Jun. 2005 (4 pages).
Chaji et al.: "A low-power high-performance digital circuit for deep submicron technologies"; dated Jun. 2005 (4 pages).
Chaji et al.: "A novel a-Si:H AMOLED pixel circuit based on short-term stress stability of a-Si:H TFTs"; dated Oct. 2005 (3 pages).
Chaji et al.: "A Novel Driving Scheme and Pixel Circuit for AMOLED Displays"; dated Jun. 2006 (4 pages).
Chaji et al.: "A novel driving scheme for high-resolution large-area a-Si:H AMOLED displays"; dated Aug. 2005 (4 pages).
Chaji et al.: "A Stable Voltage-Programmed Pixel Circuit for a-Si:H AMOLED Displays"; dated Dec. 2006 (12 pages).
Chaji et al.: "A Sub-μA fast-settling current-programmed pixel circuit for AMOLED displays"; dated Sep. 2007.
Chaji et al.: "An Enhanced and Simplified Optical Feedback Pixel Circuit for AMOLED Displays"; dated Oct. 2006.
Chaji et al.: "Compensation technique for DC and transient instability of thin film transistor circuits for large-area devices"; dated Aug. 2008.
Chaji et al.: "Driving scheme for stable operation of 2-TFT a-Si AMOLED pixel"; dated Apr. 2005 (2 pages).
Chaji et al.: "Dynamic-effect compensating technique for stable a-Si:H AMOLED displays"; dated Aug. 2005 (4 pages).
Chaji et al.: "Electrical Compensation of OLED Luminance Degradation"; dated Dec. 2007 (3 pages).
Chaji et al.: "eUTDSP: a design study of a new VLIW-based DSP architecture"; dated May 2003 (4 pages).
Chaji et al.: "Fast and Offset-Leakage Insensitive Current-Mode Line Driver for Active Matrix Displays and Sensors"; dated Feb. 2009 (8 pages).
Chaji et al.: "High Speed Low Power Adder Design With A New Logic Style: Pseudo Dynamic Logic (SDL)"; dated Oct. 2001 (4 pages).
Chaji et al.: "High-precision, fast current source for large-area current-programmed a-Si flat panels"; dated Sep. 2006 (4 pages).
Chaji et al.: "Low-Cost AMOLED Television with IGNIS Compensating Technology"; dated May 2008 (4 pages).
Chaji et al.: "Low-Cost Stable a-Si:H AMOLED Display for Portable Applications"; dated Jun. 2006 (4 pages).
Chaji et al.: "Low-Power Low-Cost Voltage-Programmed a-Si:H AMOLED Display"; dated Jun. 2008 (5 pages).
Chaji et al.: "Merged phototransistor pixel with enhanced near infrared response and flicker noise reduction for biomolecular imaging"; dated Nov. 2008 (3 pages).
Chaji et al.: "Parallel Addressing Scheme for Voltage-Programmed Active-Matrix OLED Displays"; dated May 2007 (6 pages).
Chaji et al.: "Pseudo dynamic logic (SDL): a high-speed and low-power dynamic logic family"; dated 2002 (4 pages).
Chaji et al.: "Stable a-Si:H circuits based on short-term stress stability of amorphous silicon thin film transistors"; dated May 2006 (4 pages).
Chaji et al.: "Stable Pixel Circuit for Small-Area High- Resolution a-Si:H AMOLED Displays"; dated Oct. 2008 (6 pages).
Chaji et al.: "Stable RGBW AMOLED display with OLED degradation compensation using electrical feedback"; dated Feb. 2010 (2 pages).
Chaji et al.: "Thin-Film Transistor Integration for Biomedical Imaging and AMOLED Displays"; dated 2008 (177 pages).
Jafarabadiashtiani et al.: "A New Driving Method for a-Si AMOLED Displays Based on Voltage Feedback"; dated 2005 (4 pages).
Joon-Chul Goh et al., "A New a-Si:H Thin-Film Transistor Pixel Circuit for Active-Matrix Organic Light-Emitting Diodes", IEEE Electron Device Letters, vol. 24, No. 9, Sep. 2003, pp. 583-585.
Lee et al.: "Ambipolar Thin-Film Transistors Fabricated by PECVD Nanocrystalline Silicon"; dated 2006 (6 pages).
Ma E Y et al.: "organic light emitting diode/thin film transistor integration for foldable displays" dated Sep. 15, 1997(4 pages).
Matsueda y et al.: "35.1: 2.5-in. AMOLED with Integrated 6-bit Gamma Compensated Digital Data Driver"; dated May 2004.
Nathan A. et al., "Thin Film imaging technology on glass and plastic" ICM 2000, proceedings of the 12 international conference on microelectronics, dated Oct. 31, 2001 (4 pages).
Nathan et al.: "Backplane Requirements for Active Matrix Organic Light Emitting Diode Displays"; dated 2006 (16 pages).
Nathan et al.: "Call for papers second international workshop on compact thin-film transistor (TFT) modeling for circuit simulation"; dated Sep. 2009 (1 page).
Nathan et al.: "Driving schemes for a-Si and LTPS AMOLED displays"; dated Dec. 2005 (11 pages).
Nathan et al.: "Invited Paper: a -Si for AMOLED—Meeting the Performance and Cost Demands of Display Applications (Cell Phone to HDTV)", dated 2006 (4 pages).
Philipp: "Charge transfer sensing" Sensor Review, vol. 19, No. 2, Dec. 31, 1999, 10 pages.
Rafati et al.: "Comparison of a 17 b multiplier in Dual-rail domino and in Dual-rail D L (D L) logic styles"; dated 2002 (4 pages).
Safavaian et al.: "Three-TFT image sensor for real-time digital X-ray imaging"; dated Feb. 2, 2006 (2 pages).
Safavian et al.: "3-TFT active pixel sensor with correlated double sampling readout circuit for real-time medical x-ray imaging"; dated Jun. 2006 (4 pages).
Safavian et al.: "A novel current scaling active pixel sensor with correlated double sampling readout circuit for real time medical x-ray imaging"; dated May 2007 (7 pages).
Safavian et al.: "A novel hybrid active-passive pixel with correlated double sampling Cmos readout circuit for medical x-ray imaging"; dated May 2008 (4 pages).
Safavian et al.: "Self-compensated a-Si:H detector with current-mode readout circuit for digital X-ray fluoroscopy"; dated Aug. 2005 (4 pages).
Safavian et al.: "TFT active image sensor with current-mode readout circuit for digital x-ray fluoroscopy [5969D-82]"; dated Sep. 2005 (9 pages).
Stewart M. et al., "polysilicon TFT technology for active matrix oled displays" IEEE transactions on electron devices, vol. 48, No. 5, dated May 2001 (7 pages).
Vygranenko et al.: "Stability of indium-oxide thin-film transistors by reactive ion beam assisted deposition"; dated 2009.
Wang et al.: "Indium oxides by reactive ion beam assisted evaporation: From material study to device application"; dated Mar. 2009 (6 pages).
Yi He et al., "Current-Source a-Si:H Thin Film Transistor Circuit for Active-Matrix Organic Light-Emitting Displays", IEEE Electron Device Letters, vol. 21, No. 12, Dec. 2000, pp. 590-592.
European Search Report, Application No. 12179013.3-1508, dated May 6, 2013, (6 pages).

* cited by examiner

… (1)

THIN FILM TRANSISTOR INCLUDING A NANOCONDUCTOR LAYER

CROSS-REFERENCE TO RELATED APPLICATION

This application claims the benefit of U.S. Provisional Application No. 61/514,887, filed Aug. 3, 2011, which is hereby incorporated by reference herein in its entirety.

FIELD OF THE INVENTION

The present disclosure generally relates to thin film transistors, and particularly to thin film transistors having a channel region including nanowires or nanotubes.

BACKGROUND

Displays can be created from an array of organic light emitting devices ("OLEDs") each controlled by individual circuits (i.e., pixel circuits) having transistors for selectively controlling the circuits to be programmed with display information and to emit light according to the display information. Thin film transistors ("TFTs") fabricated on a substrate can be incorporated into such displays.

Mobility characterizes the responsiveness of a charge carrier in the presence of an electric field. Mobility is generally expressed in units of $cm^2/V \cdot s$. For transistors, the mobility of the channel region provides a measure of the performance of the transistor "on" current, e.g., the current that can be supplied by the transistor. In thin film transistors, a layer of semiconductor material is generally utilized to form the channel region.

Development of OLED display devices is challenged by the demand for a suitable drive transistor in the pixel circuits. Amorphous silicon (a-Si), the transistor channel material that sources the voltage to switch AM-LCD pixels, has a low mobility ($\sim 0.1 \text{ cm}^2 \text{ V}^{-1} \text{ s}^{-1}$). Organic semiconductor channel materials are attractive for use as pixel circuit drive transistors for their homogeneity, low cost, and the variety of means by which they can be deposited, but their best mobilities are similar to that of a-Si. In a typical TFT architecture, low-mobility channel layers would require a large source-drain voltage to drive the necessary current. This consumes power in the transistor (as opposed to light production in the OLED), compromising the power savings.

P-type a-Si TFTs can have even lower mobility values, and can be as low as $0.01 \text{ cm}^2 \text{V}^{-1} \text{s}^{-1}$.

SUMMARY

Aspects of the present disclosure provide a thin film transistor ("TFT") suitable for use as an organic light emitting diode ("OLED") drive transistor in a pixel circuit for a display. The TFT includes a channel region having two layers: a semiconductor layer and a nanoconductor layer. The nanoconductor layer can be a dispersed monolayer of nanotubes and/or nanowires formed of carbon. The individual nanoconductors in the nanoconductor layer are generally aligned along a direction oriented from the drain terminal to the source terminal. The nanoconductor layer is separated from both the drain terminal and the source terminal by the semiconductor layer. Thus the nanoconductor layer is generally situated between the semiconductor layer and a dielectric layer on the gate terminal.

In operation of the TFT, the effective mobility is enhanced. During high field effect operation (e.g., high gate-source voltages), the charge transfer characteristics of the channel region is enhanced by charges being conducted through the nanoconductors. For example, charge carriers can be conveyed via the nanoconductors to/from regions of the semiconductor close to the drain/source terminals of the TFT. Thus, the ability to convey charge carriers within the semiconductor region is supplemented by the nanoconductors. However, during low field effect operation (e.g., low gate-source voltages), the performance of the TFT is dominated by the semiconductor layer because the nanoconductors lack any direct contact with the source or drain terminal of the TFT. Thus, the TFT offers good leakage current performance.

The foregoing and additional aspects and embodiments of the present invention will be apparent to those of ordinary skill in the art in view of the detailed description of various embodiments and/or aspects, which is made with reference to the drawings, a brief description of which is provided next.

BRIEF DESCRIPTION OF THE DRAWINGS

The foregoing and other advantages of the invention will become apparent upon reading the following detailed description and upon reference to the drawings.

Figure 1:
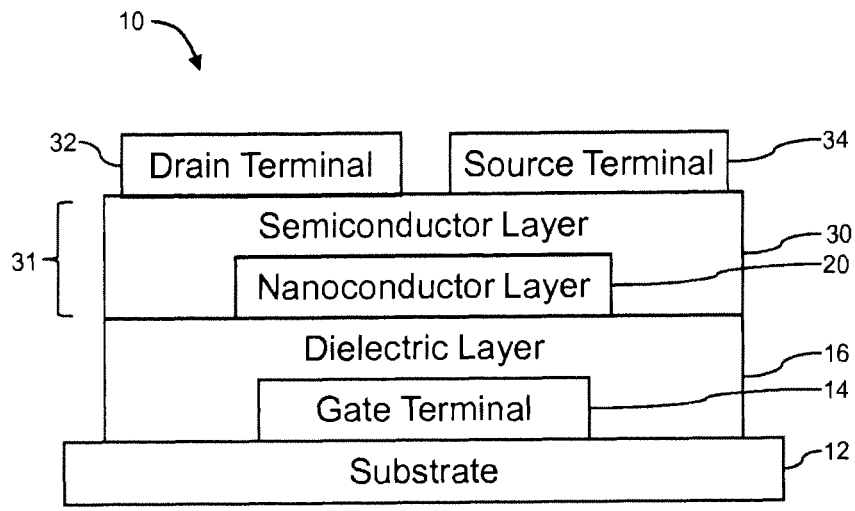
FIG. 1 illustrates a block diagram of a bottom gate thin film transistor having a channel region including a nanoconductor layer.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

FIG. 1 illustrates a block diagram of a bottom-gate thin film transistor 10 having a channel region 31 including a nanoconductor layer 20. The thin film transistor 10 can generally be formed by deposition or a similar process on a substrate 12 of a display. For example, the substrate 12 can be a back plane substrate or an encapsulation glass substrate, or another suitable substrate providing a surface on which the TFT 10 can be developed. A gate terminal 14 is formed on the substrate 12. The gate terminal 14 is a conductive electrode for receiving signals to operate the TFT 10. The signals applied to the gate terminal 14 can be binary "high" or "low" signals turning the TFT 10 on or off or can be signals at a plurality of levels to control the amount of current conveyed through the drain and source terminals.

A dielectric layer 16 ("insulating layer") is developed over the gate terminal 14 to prevent current flow to or from the gate terminal 14 and the channel region 31 of the TFT 10. The dielectric layer 16 can be developed by a deposition process. A layer of nanoconductors, i.e., a nanoconductor layer 20, is then placed ("positioned") on the dielectric layer 16. The nanoconductor layer 20 generally includes a plurality of nanoconductors and can include nanowires, nanofibers, and/or nanotubes, such as single-wall nanotubes ("SWNT"), double-wall nanotubes ("DWNT") and/or multi-wall nanotubes ("MWNT"). The nanoconductors can be formed of Carbon and/or Silicon and can optionally incorporate doping materials to modify the conductive properties of the nanoconductors. The nanoconductor layer 20 can be a single layer (i.e., monolayer) of nanoconductors.

A semiconductor layer 30 is developed over the nanoconductor layer 20. Together, the semiconductor layer 30 and the nanoconductor layer 20 form the two-layer channel region 31 of the TFT 10. For example, the semiconductor layer 30 can be made from organic or inorganic semiconductor materials. The semiconductor layer 30 can be formed of, for example, amorphous silicon or polysilicon. The semiconductor layer 30 can also incorporate doping to modify the mobility characteristics of the TFT 10.

The drain terminal 32 and source terminal 34 of the TFT are then formed on the semiconductor layer. The drain terminal 32 and the source terminal 34 are each formed of a conductive material suitable for conveying electrical energy. The terminals 32, 34 can be, for example, metallic. A channel separation distance is defined by the distance between the drain terminal 32 and the source terminal 34. The channel separation distance is one parameter that influences the operation performance of the TFT 10.

The TFT 10 is referred to as a bottom-gate TFT because the gate 14 is formed directly on the substrate 12, and thus the side of the TFT 10 having the gate 14 is referred to as a bottom side of the TFT 10, while the side of the TFT 10 having the drain and source terminals 32, 34 is referred to as a top side of the TFT 10.

Figure 2:
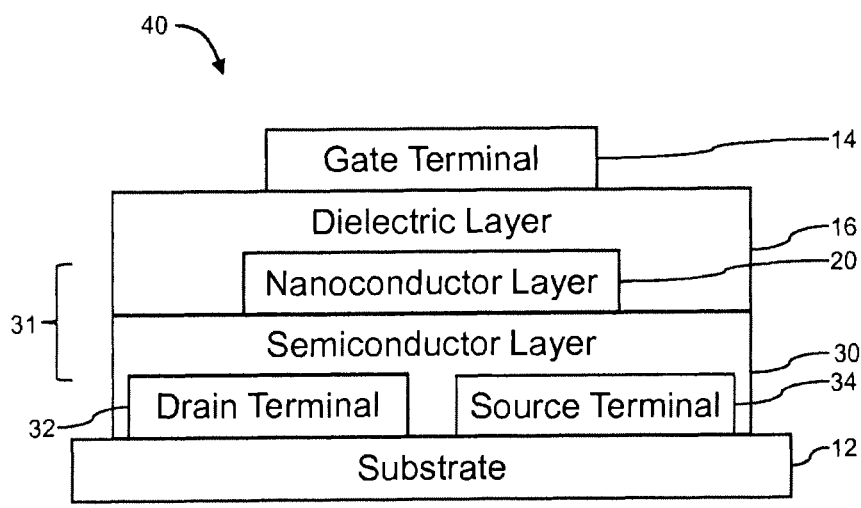
FIG. 2 illustrates a block diagram of a top gate thin film transistor having a channel region including a nanoconductor layer.

FIG. 2 illustrates a block diagram of a top-gate thin film transistor 40 having a channel region 31 including a nanoconductor layer 20. The top-gate TFT 40 is manufactured by applying the layered components discussed in connection with the bottom-gate TFT 10 shown in FIG. 1 in the reverse order. The drain terminal 32 and source terminal 34 are each formed on the substrate 12. The semiconductor layer 30 is then deposited on the drain and source terminals 32, 34. The nanoconductor layer 20 is then applied to the semiconductor layer 30 to form the two-layer channel region 31. By applying the nanoconductor layer 20 to the surface of the semiconductor layer 30 opposite the drain and source terminals 32, 34, the nanoconductor layer 20 is positioned to lack any direct contact with the drain and source terminals 32, 34. Thus, during low field effect operation (e.g., low gate-source voltages), the performance of the TFT is dominated by the semiconductor layer because the nanoconductors lack any direct contact with the source or drain terminal of the TFT. The TFT therefore offers good leakage current performance, similar to the performance of the semiconductor layer 30. The dielectric layer 16 is then developed on the nanoconductor side of the channel region 31 and the gate terminal 14 is formed on the dielectric layer 16.

Moreover, the nanoconductors the nanoconductor layer can change the polarity of the TFT device. For example, carbon nanotubes have a p-type characteristic. An amorphous silicon (a-Si) TFT formed with its channel region including carbon nanotubes can therefore have a p-type characteristic. A p-type a-Si TFT so formed can be highly beneficial to a-Si TFT applications due to the enhanced mobility of such a p-type transistor compared to conventional p-type TFTs. The enhanced mobility of such a p-type transistor compared to conventional p-type TFTs can advantageously allow such p-type a-Si TFTs to be utilized in AMOLED display applications previously dominated by n-type TFTs and thereby enable p-type pixel circuit architectures.

Figure 3A:
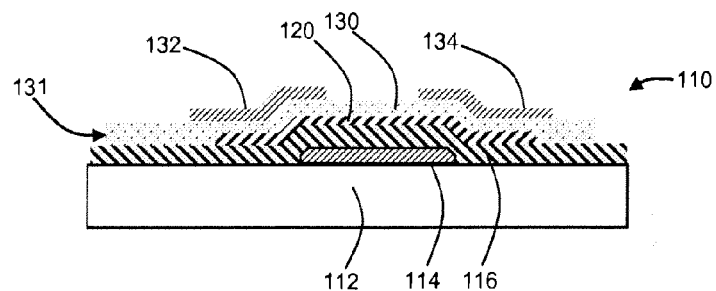
FIG. 3A is a schematic illustration of a cross-section view of a thin film transistor 110 having a channel region including a nanoconductor layer.

FIG. 3A is a schematic illustration of a cross-section view of a thin film transistor 110 ("TFT") having a channel region 131 including a nanoconductor layer 120. In the schematic illustration in FIG. 3A, the components of the TFT 110 are numbered with reference numbers one-hundred higher than the corresponding components of the TFT 10 in the block diagram of FIG. 1. The TFT 110 is formed on a substrate 112, which can be substrate of a display, such as a back plane substrate, a transparent planarization substrate, or an encapsulation glass substrate. A gate terminal 114 is formed on the substrate 112. The gate terminal 114 can be a conductive terminal with characteristics similar to the characteristics of the gate terminal 14 described in connection with FIG. 1. A dielectric layer 116 is developed on the gate terminal 114 to insulate the gate terminal 114 from the channel region 131 of the TFT 110. The dielectric layer 116 can be an electrical insulator.

The channel region 131 of the TFT has two layers: a nanoconductor layer 120 and a semiconductor layer 130. The semiconductor layer 130 separates the nanoconductor layer 120 from direct contact with the drain terminal 132 or the source terminal 134. The nanoconductor layer 120 generally includes a plurality of nanowires, nanofibers, and/or nanotubes. The individual nanoconductors ("nanoparticles") in the nanoconductor layer 120 are placed on the dielectric layer 116 in a thin film. The individual nanoconductors are each desirably aligned generally in a direction oriented from the drain terminal 132 to the source terminal 134 to increase the efficacy of charge transfer between the drain and source terminals 132, 134.

Figure 3B:
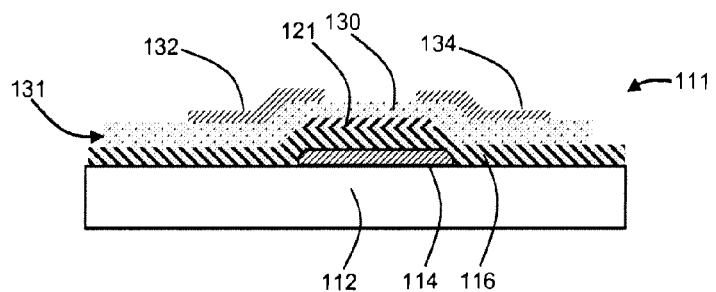
FIG. 3B is a schematic illustration of a thin film transistor similar to the one illustrated in FIG. 3A, but with a shorter nanoconductor layer.

FIG. 3B is a schematic illustration of a thin film transistor 111 similar to the one illustrated in FIG. 3A, but with a shorter nanoconductor layer 121. The schematic illustration in FIG. 3B illustrates that the drain and source terminals 132, 134 can overlap the nanoconductor layer 121 by varying amounts. By adjusting the dimensional extent of the nanoconductor layer 121 along a direction oriented from the drain terminal 132 to the source terminal 134, the charge transfer characteristics of the two-layer channel region 131 can be modified. For example, the two-layer channel region 131 can provide for relatively more charge transfer (e.g., increased mobility) by increasing the dimensional extent (e.g., length) of the nanoconductor layer 121, by increasing the density of nanoconductors within the nanoconductor layer 121, and/or by increasing the amount of overlap with the drain terminal 132 and/or source terminal 134. As discussed herein, the amount of overlap between the nanoconductor layer 121 and the drain and source terminals 132, 134 refers to the amount of surface area of the drain/source terminals 132, 134 which is separated from the nanoconductor layer 121 only by a vertical path through the semiconductor layer 130. In FIGS. 3A and 3B, the vertical direction through the semiconductor layer 130 is the direction outwardly normal to the substrate 112.

Aspects of the present disclosure further provide that the nanoconductor layer 121 can be configured with a dimensional extent along the direction oriented from the drain terminal 132 to the source terminal 134 to not overlap either of the drain or source terminals 132, 134. For example, the length of the nanoconductor layer 121 can be less than the separation distance between the drain terminal 132 and the source terminal 134. Additional configurations of the nanoconductor layer 121 are illustrated generally by the top view schematic illustrations in FIG. 4A through 4C.

Figure 4A:
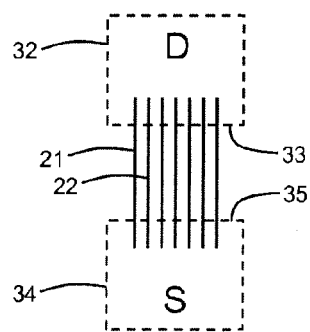
FIG. 4A is a schematic illustration of a top view of a nanoconductor layer with a characteristic length exceeding the separation between the drain and source terminals of the TFT.

FIG. 4A is a schematic illustration of a top view of a nanoconductor layer with a characteristic length exceeding the separation between the drain and source terminals of the TFT. While the nanoconductor layer 20 is illustrated for schematic purposes with individual nanoconductors (e.g., the nanoconductors 21, 22) of uniform length and each aligned between the drain terminal 32 and the source terminal 34, the present disclosure is no so limited. Aspects of the present disclosure apply to configurations with a nanoconductor layer 20 having individual nanoconductors of non-uniform length and orientation. The schematic illustration of the nanoconductor layer 20 in FIG. 4A also illustrates that the individual nanoconductors (e.g., the nanoconductors 21, 22) are disposed in a monolayer. The nanoconductor layer 20 can be a dispersed monolayer of nanoconductors that covers less than a full cross-sectional area of the two-layer channel region. For example, the gaps between the individual nanoconductors (e.g., the nanoconductors 21, 22) can be of roughly the same size as the widths of the nanoconductors themselves such that the individual nanoconductors (e.g., the nanoconductors 21, 22) in the nanoconductor layer 20 cumulatively cover approximately half (e.g., 50%) of the two-layer channel region. In an implementation, any gaps between the individual nanoconductors (e.g., the nanoconductors 21, 22) are filled by the semiconductor layer deposited over the nanoconductor layer 20. The nanoconductor layer 20 can be implemented with coverage of greater or lesser than 50% coverage, such as 30% coverage or 70% coverage. Generally, increasing the density of the monolayer of nanoconductors (e.g., the fraction of coverage) can increase the charge transfer characteristics of the two-layer channel region.

Figure 4B:
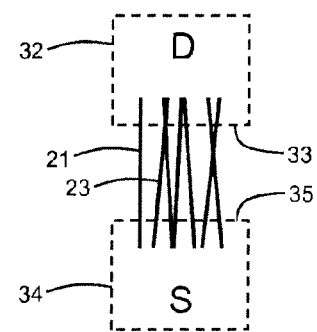
FIG. 4B is a schematic illustration of a top view of the nanoconductor layer similar to FIG. 4A, but where the individual nanoconductors are imperfectly aligned with a direction oriented from the drain terminal to the source terminal.
Figure 4C:
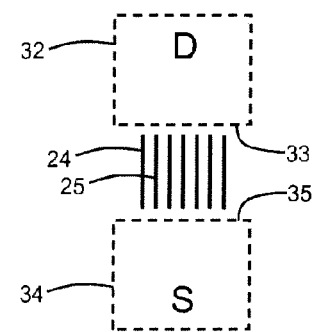
FIG. 4C is a schematic illustration of a top view of the nanoconductor layer similar to FIG. 4A, but where the characteristic length of the nanoconductor layer is less than the separation of the drain and source terminals of the TFT.

In FIGS. 4A through 4C, the hashed blocks labeled "D" and "S" represent the positions of the drain terminal 32 and source terminal 34, respectively. The drain terminal 32 has a channel side 33 and the source terminal 34 has a channel side 35. The distance between the channel side 33 of the drain terminal 32 and the channel side 35 of the source terminal 34 can be referred to for convenience as a channel separation distance. As shown in FIG. 4A, the length of the nanoconductor layer 20 can be greater than the channel separation distance between the drain terminal 32 and the source terminal 34 such that the drain terminal 32 and the source terminal 34 each overlap at least a portion of the nanoconductor layer 20. By overlapping at least a portion of the nanoconductor layer 20 with the drain/source terminals 32, 34, the nanoconductor layer 20 advantageously allows for a vertical connection path through the semiconductor layer to enhance the charge transfer characteristics of the two-layer channel region.

FIG. 4B is a schematic illustration of a top view of the nanoconductor layer similar to FIG. 4A, but where the individual nanoconductors (e.g, the nanoconductors 21, 23) are imperfectly aligned with a direction oriented from the drain terminal 32 to the source terminal 34. Because the nanoconductor layer 20 is not directly connected to either of the drain/source terminals 32, 34 (i.e., the nanoconductor layer 20 is connected to the drain/source terminals only through the semiconductor layer), the charge transfer characteristics of the two-layer channel region are relatively insensitive to precise alignment requirements of the individual nanoconductors (e.g., the nanoconductor 23). Thus, the nanoconductors (e.g., the nanoconductors 21, 23) generally enhance the effective mobility of the two-layer channel region by conveying charges to/from the drain/source terminals 32, 34 through the semiconductor layer such that the charge transfer characteristics of the thin film transistor is not limited by the mobility of the semiconductor layer.

FIG. 4C is a schematic illustration of a top view of the nanoconductor layer similar to FIG. 4A, but where the characteristic length of the nanoconductor layer is less than the separation of the drain and source terminals of the TFT. In the schematic illustration in FIG. 4C, the individual nanoconductors (e.g., the nanoconductors 24, 25) are illustrated as having a length less than the channel separation distance. In the configuration illustrated in FIG. 4C, the nanoconductor layer 20 does not overlap either the drain terminal 32 or the source terminal 34. Thus, a charge transfer path does not exist from the drain/source terminals 32, 34 to the nanoconductor layer 20 that includes only a vertical charge transfer path through the semiconductor layer. For example, in the configuration illustrated in FIG. 4C, the effective mobility of the two-layer channel region can be limited by the requirement that charges are transferred laterally through the semiconductor layer.

Figure 5:
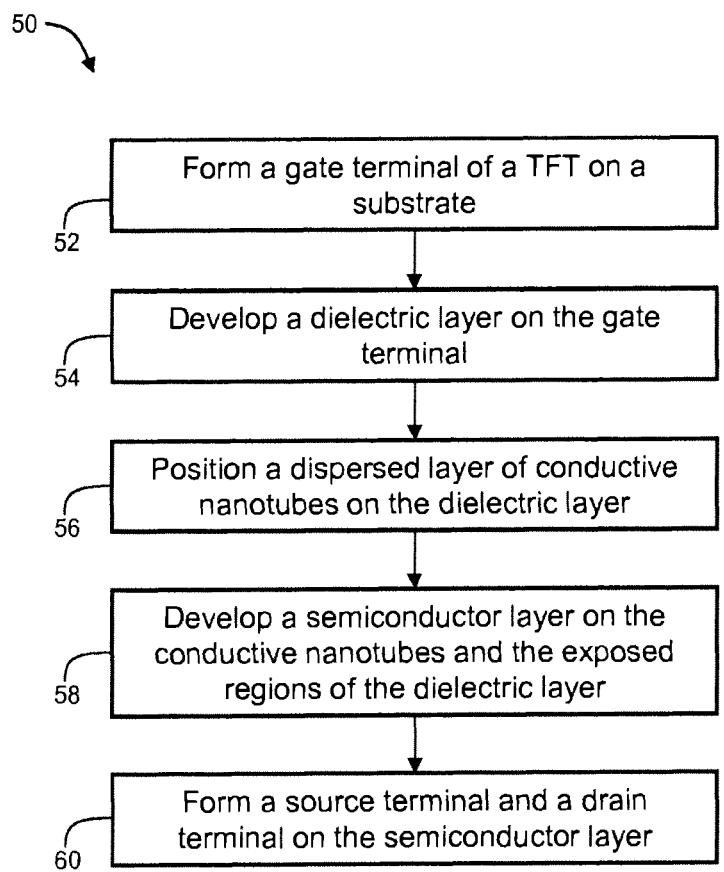
FIG. 5 is a flowchart illustrating an example process for manufacturing a thin film transistor having a channel region including a nanoconductor layer.

FIG. 5 is a flowchart 50 illustrating an example process for manufacturing a thin film transistor ("TFT") having a channel region including a nanoconductor layer. A gate terminal of a TFT is formed on a substrate in the first step 51. Next, a dielectric layer is developed on the gate terminal 54 in step 52. The dielectric layer coats the exposed surfaces of the gate terminal so as to prevent the two-layer channel region, which is deposited next, from directly contacting the gate terminal. A dispersed layer of nanoconductors, such as nanotubes or nanowires, are positioned on the dielectric layer in step 53. As discussed in connection with FIGS. 3A through 3C, the dispersed layer of nanoconductors can be a monolayer covering less than the full exposed area of the channel region. In step 54, a semiconductor layer is deposited on the nanoconductor layer and any exposed regions of the dielectric layer. The semiconductor layer can include amorphous silicon. The semiconductor layer and the nanoconductor layer thus jointly form the two-layer channel region. A source terminal and a drain terminal are then formed on the semiconductor layer in step 55. The source terminal and the drain terminal are thus formed so as to lack a direct connection with the nanoconductors.

The flowchart 50 is an example of a process for manufacturing a bottom-gate TFT (i.e., the gate terminal is deposited on the substrate). However, a similar process can be adapted to manufacture a top-gate TFT having a two-layer channel region incorporating nanoconductors that do not directly contact the drain or source terminals, such as the top-gate TFT 40 shown in FIG. 2. For example, a drain and a source terminal can be formed on a substrate. A semiconductor layer can be deposited over the drain and source terminals, and a nanoconductor layer can be placed over the semiconductor layer, thus forming a two-layer channel region. A dielectric layer can be deposited over the two-layer channel region, and a gate terminal can be formed on the dielectric layer.

Figure 6:
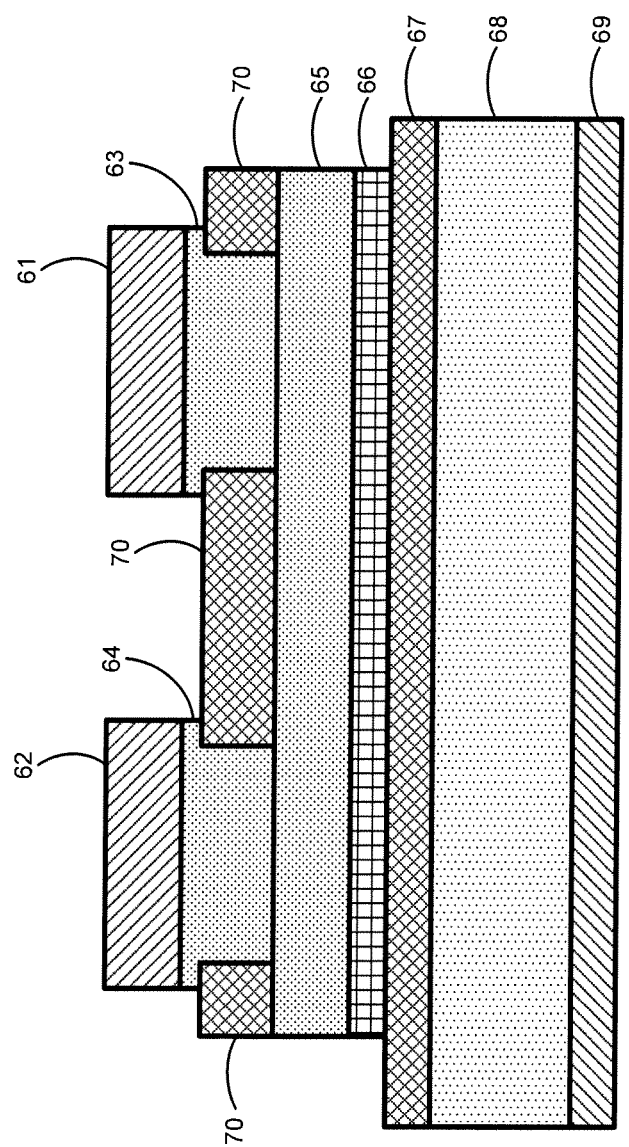
FIG. 6 is a diagrammatic cross section of a thin film transistor having a channel region including a nanoconductor layer.

FIG. 6 illustrates a modified structure in which metallic source and drain terminals 61 and 62 (e.g., aluminum having a thickness of about 100 nanometers) are formed on respective layers 63 and 64 of p+ silicon (e.g., with a thickness of about 35 nanometers). Directly beneath the layers 63 and 64 is a layer 65 of a semiconductor material (e.g., alternating nanocrystalline and amorphous silicon having a total thickness of about 30 nanometers), which is deposited on top of a layer 66 of nanoconductors such as carbon nanotubes (e.g., with a thickness of about 1 to 2 nanometers). The nanoconductors are deposited on top of a dielectric layer 67 (e.g., thermal silicon dioxide with a thickness of about 100 nanometers), which in turn is deposited on a substrate 68 (e.g., p+ silicon). The bottom surface of the substrate 67 is covered with a conductive back contact 69 (e.g., aluminum with a thickness of about 100 nanometers).

An exemplary process for forming the structure shown in FIG. 6 is as follows:

1. Thermal P$^+$ Silicon Substrate Cleaning
   (a) Ultrasonic cleaning of the substrate in acetone for 10 minutes, then in isopropyl alcohol (IPA) for another 10 minutes. This process is repeated twice.
   (b) Substrate is rinsed with deionized water and dried with nitrogen.
   Note: The substrate is put on a hotplate (~90° C.) for 10 minutes before the next step.
2. Carbon nanotube coating
   (a) Substrate treatment using amino-propyl tri-ethoxy silane (APTES).
   Before coating, the substrate is immersed into APTES solution (1% v/v in IPA) for 20 minutes, then the substrate is rinsed with IPA and dried with nitrogen.
   (b) Dip coating carbon nanotubes on APTES-treated substrate
   The substrate is immersed into carbon nanotubes solution for 15 minutes.
   Then the substrate is rinsed with abundant deionized water and dried with nitrogen.
   The carbon nanotube-coated substrate is baked on a hotplate at 180° C. for 20 minutes before it is loaded into a plasma enhanced chemical vapor deposition (PECVD) cluster.
3. Nanocrystalline amorphous silicon (nc-Si) and SiNx deposition using PECVD
   (a) nc-Si (~30 nm.)
   Gas: $SiH_4/H_2$=40/200 sccm; Pr=900 mtorr; $R_F$=2 W; T=210 C (set); Rate=4.07 nm/min.
   (b) SiNx (150 nm)
   Gas: $SiH_4/NH_3/N_2$=5/100/50 sccm; Pr=1000 mtorr; $R_F$=15 W; T=250 C (set); Rate=15 nm/min.
4. $SiN_x$ Via (Mask #1)
   (a) Photolithography
   Photoresist: NLOF 2035
   Spin: 500 rpm for 10 seconds followed by 4000 rmp for 90 seconds.
   Soft bake: 110° C. for 1 minute
   Contact: low vacuum.
   Exposure: 5.4 seconds.
   Post-exposure bake: 110° C.
   Develop: AZ300 MIF for ~30 seconds.
   (b) Wet etching $SiN_x$ using buffered hydrofluoric acid (BHF).
   The substrate is immersed in a BHF solution (10% v/v) for 27 seconds.
   (c) Strip of Photoresist
   The substrate is immersed in AZ KWIT stripper for 10 minutes, then rinsed by deionized water, acetone and IPA.
5. P$^+$ Deposition (~35 nm thickness)
   Gas: $SiH_4/B_2H_6/H2$=1.8/1.8/200 sccm; Pr=1500 mtorr; $R_F$=65 W; T=250 C, (set); Rate=7.7 nm/min.
6. S/D metal deposition (aluminum, ~100 nm thickness)
7. S/D patterning (Mask #1')
   Photoresist: AZ 3312
   Spin: 700 rpm for 10 seconds followed by 4000 rmp for 60 seconds.
   Soft bake: 90° C. for 1 minute.
   Contact: low vacuum.
   Exposure: 4 seconds.
   Post-exposure bake: 120° C. for 1 minute.
   Develop: AZ300 MIF for ~15 seconds.
   Etching: ~3 minutes in PAN etchant at room temperature.
   Strip: Rinsed in AZ KWIT stripper for 4 minutes, then rinsed with deionized water, acetone and IPA.
8. Separation of P$^+$ using S/D Metal as hard mask.
   RIE dry-etching P+ silicon:
   $R_F$=50 W; $P_r$=20 mtorr; $CF_4/H_2$=20/3 sccm; rate=~0.43 nm/s
9. Device separation and isolation (Mask #2)
   (a) Photolithography
   Spin: 700 rpm for 10 seconds followed by 4000 rmp for 60 seconds.
   Soft bake: 90° C. for 1 minute.
   Contact: low vacuum.
   Exposure: 4 seconds.
   Post-exposure bake: 120° C. for 1 minute.
   Develop: AZ300 MIF for ~15 seconds.
   (b) Dry-etching $SiN_x$/Si/carbon nanotubes.
   $R_F$=125 W; $P_r$=150 mtorr; $CF_4/O_2$=43/5 sccm; rate=~4 nm/s.
10. Back Contact Metal Deposition (aluminum, ~100 nm thickness)
    (a) Removal of back thermal oxide.
    The wafer front side is protected by PR AZ3312 before it is immersed into BHF (10% v/v) for 4 minutes.
    (b) Metal deposition on the back side of the wafer.
    After the thermal oxide on the back side of the wafer is removed by BHF, the wafer is loaded into a vacuum chamber immediately for the metal deposition.

While particular embodiments and applications of the present invention have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

What is claimed is:

1. A thin film transistor comprising:
   a gate terminal, a drain terminal, and a source terminal; and
   a two-layer channel region including:
     a semiconductor layer having a first side proximate the drain terminal and the source terminal,
     a dielectric layer between said semiconductor layer and said gate terminal, and
     a nanoconductor layer between said dielectric layer and the second side of the semiconductor layer, said nanoconductor layer being a monolayer of nanowires or nanotubes dispersed to sparsely cover the second side of the semiconductor layer and extending between the drain terminal and the source terminal.

2. The thin film transistor of claim 1, wherein the semiconductor layer includes amorphous silicon.

3. The thin film transistor of claim 1, wherein the nanoconductor layer includes a plurality of nanowires formed of carbon.

4. The thin film transistor of claim 1, wherein the nanoconductor layer includes a plurality of nanotubes formed of carbon.

5. A thin film transistor comprising:
a gate terminal, a drain terminal, and a source terminal; and
a two-layer channel region including:
   a semiconductor layer having a first side proximate the drain terminal and the source terminal, and a second side proximate the gate terminal, and
   a nanoconductor layer directly adjacent the second side of the semiconductor layer,
wherein a voltage applied to the gate terminal influences the conductivity of the channel region by developing an electric field therein, and wherein the performance of the two-layer channel region is dominated by the semiconductor layer at low field effect levels so as to prevent leakage current, and wherein the performance of the two-layer channel region is influenced by the nanoconductor layer at high field effect levels so as to enhance the charge transfer characteristics of the two-layer channel region.

6. A thin film transistor comprising:
a gate terminal, a drain terminal, and a source terminal; and
a two-layer channel region including:
   a semiconductor layer having a first side proximate the drain terminal and the source terminal, and a second side proximate the gate terminal, and
   a nanoconductor layer directly adjacent the second side of the semiconductor layer, and
wherein the nanoconductor layer includes a plurality of nanowires or nanotubes aligned generally in a direction oriented from the source terminal to the drain terminal, and wherein a dimensional extent of the nanoconductor layer along the direction between the source and drain terminals exceeds a separation between the source and drain terminals such that the nanoconductor layer at least partially overlaps both the source terminal and the drain terminal.

7. A thin film transistor comprising:
a gate terminal, a drain terminal, and a source terminal; and
a two-layer channel region including:
   a semiconductor layer having a first side proximate the drain terminal and the source terminal, and a second side proximate the gate terminal, and
   a nanoconductor layer directly adjacent the second side of the semiconductor layer, and
wherein the thin film transistor is a bottom gate thin film transistor, and wherein, during a manufacturing of the thin film transistor, the semiconductor layer is deposited on the nanoconductor layer.

8. A thin film transistor comprising:
a gate terminal, a drain terminal, and a source terminal; and
a two-layer channel region including:
   a semiconductor layer having a first side proximate the drain terminal and the source terminal, and a second side proximate the gate terminal, and
   a nanoconductor layer directly adjacent the second side of the semiconductor layer, and
wherein the thin film transistor is a top gate thin film transistor, and wherein, during a manufacturing of the thin film transistor, the nanoconductor layer is placed on the semiconductor layer prior to a dielectric layer being deposited on the nanoconductor layer.

9. A thin film transistor comprising:
a gate terminal, a drain terminal, and a source terminal; and
a two-layer channel region including:
   a semiconductor layer having a first side proximate the drain terminal and the source terminal, and a second side proximate the gate terminal, and
   a nanoconductor layer directly adjacent the second side of the semiconductor layer, and
wherein the nanoconductor layer lacks any physical contact with the gate terminal, the source terminal, or the drain terminal.

10. A method of manufacturing a thin film transistor, the method comprising:
forming a gate terminal from a conductive material on a substrate;
developing, on the gate terminal, a dielectric layer to electrically insulate the gate terminal;
placing, on the dielectric layer, a nanoconductor layer;
developing, on the nanoconductor layer, a semiconductor layer; and
developing, on the semiconductor layer, a drain terminal and a source terminal.

11. The method of claim 10, wherein the semiconductor layer includes amorphous silicon.

12. The method of claim 10, wherein the nanoconductor layer includes a plurality of nanowires or a plurality of nanotubes, and wherein the placing is carried out to substantially align the plurality of nanowires or the plurality of nanotubes along a direction extending from the source terminal to the drain terminal.

13. The method of claim 10, wherein the placing is carried out such that the nanoconductor layer is a monolayer of nanowires or nanotubes.

14. The method of claim 10 in which said dielectric layer, said semiconductor layer and said nanoconductor layer form a two-layer channel region, and said nanoconductor layer is a monolayer of nanowires or nanotubes dispersed to sparsely cover the second side of the semiconductor layer and extending between the drain terminal and the source terminal.

* * * * *